United States Patent [19]

Nelson

[11] Patent Number: 4,522,378
[45] Date of Patent: Jun. 11, 1985

[54] WIPER MOTOR MOUNTING GROMMET

[75] Inventor: John F. Nelson, New Lenox, Ill.

[73] Assignee: Illinois Tool Works, Inc., Chicago, Ill.

[21] Appl. No.: 548,253

[22] Filed: Nov. 2, 1983

[51] Int. Cl.³ .............................................. F16F 7/00
[52] U.S. Cl. ........................................ 267/141.4; 16/2; 248/635; 267/63 A; 267/153
[58] Field of Search ............... 267/141.1, 141.2, 141.3, 267/141.4, 63 A, 153; 248/604, 635, 634, 632, 115; 180/312, 300; 16/2, 108; 384/215; D8/354, 349; 181/207, 208, 204; 227/55; 24/297

[56] References Cited

U.S. PATENT DOCUMENTS

| D. 273,087 | 3/1984 | Johnson et al. ............... D8/354 X |
| 2,936,141 | 5/1960 | Rapata ............................... 248/604 |
| 3,065,941 | 11/1962 | Loftis .................................. 248/604 |
| 3,128,999 | 4/1964 | Schmitt .............................. 267/153 |
| 3,202,410 | 8/1965 | Schell .................................. 267/153 |
| 3,350,042 | 10/1967 | Stewart et al. ................... 267/141.4 |
| 3,525,417 | 8/1970 | Giraudeau .......................... 181/208 |
| 4,067,184 | 1/1978 | Johnson ........................... 181/207 X |
| 4,139,246 | 1/1979 | Mikoshiba et al. ........... 267/141.3 X |
| 4,232,496 | 11/1980 | Warkentin ........................... 16/2 X |
| 4,306,708 | 12/1981 | Gassaway et al. ................. 267/141.3 |

FOREIGN PATENT DOCUMENTS

| 418735 | 1/1967 | Switzerland ......................... 24/297 |
| 1114544 | 5/1968 | United Kingdom ................. 24/297 |

Primary Examiner—Bruce H. Stoner, Jr.
Assistant Examiner—Michael P. Gilday
Attorney, Agent, or Firm—J. P. O'Brien; T. W. Buckman

[57] ABSTRACT

A one-piece integral resilient grommet of elastomeric material is disclosed for isolating the vibration and noise which is propagated from a fractional horsepower motor. The resilient grommet has a central sleeve portion of resilient deformable material having a cylindrical axial opening. A pair of vibration dampening members are integrally formed on the center sleeve portion and have axially spaced apart end walls that extend radially from the central sleeve portion to define an annular recess for mounting the housing of the fractional horsepower motor. The grommet is attached to a support wall structure by a fastener that extends through the cylindrical axial opening and is brought into threaded engagement with the wall. To dampen the vibration wave propagation in the axial direction and isolate the noise of the motor from the support wall, the pair of vibration dampening members are each formed with a set of radially directed ribs which are angularly offset from each other.

3 Claims, 7 Drawing Figures

WIPER MOTOR MOUNTING GROMMET

BACKGROUND OF THE INVENTION

This invention relates to a grommet suitable for mounting a fractional horsepower motor on a support surface, and in particular relates to a resilient grommet design for mounting and isolating the vibrations of a fractional horsepower motor in relation to a support surface.

It is known to use a resilient grommet to isolate the vibrations and associated noise propagated from a fractional horsepower motor. In U.S. Pat. No. 2,936,141, which issued to G. M. Rapata and is assigned to the same assignee as this invention, there is disclosed a one-piece molded plastic motor mount employing supporting spokes for resiliently mounting the shaft ends of a motor on a support bracket. While the Rapata invention is adequate to dissipate the vibration and noise components being transmitted radially between the motor's shaft and the pair of shaft mounting brackets, it is inadequate to suppress the vibrations when mounting a motor directly on a wall surface. The reason the Rapata invention would be inadequate for mounting a motor directly to a wall surface is that it is designed to isolate vibrations radially between the motor's shaft and the surrounding circular grommet. This invention provides a resilient mounting arrangement to enable the mounting of a fractional horsepower motor's housing directly on a wall surface in a manner to effectively dampen the vibration and noise components of the motor axially of the grommet.

SUMMARY OF THE INVENTION

This invention is directed to a one-piece integral resilient grommet for isolating the vibration and noise components of a fractional horsepower motor or the like from a supporting wall surface through the use of a pair of spaced apart vibration dampening members integrally formed on a cylindrical sleeve. The vibration dampening members have a pair of end walls that are spaced apart a short distance to define a mounting recess for the motor. The two resilient vibration dampening members have a set of radial ribs that are axially offset from each other to dissipate the vibrations propagating in an axial direction of the grommet. A one-piece spool having a head portion and hollow shank portion fits into the central cylindrical opening of the grommet and cooperates with the deformable grommet to hold a fastening member that rigidly compresses the grommet and associated motor mount against the support wall surface.

DESCRIPTION OF THE DRAWING

For a better understanding of this invention reference may be made to the accompanying drawing, in which.

DESCRIPTION OF PREFERRED EMBODIMENT

Figure 1:
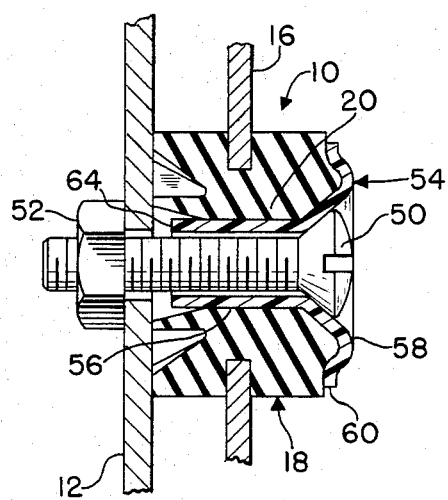
FIG. 1 is a cross-sectional view illustrating the preferred embodiment of this invention.

There is shown in FIG. 1 a one-piece resilient grommet which embodies the principles of this invention and is generally designated by the reference numeral 10. As will become more clear from the description hereinbelow, the resilient grommet 10 is particularly suitable for mounting a fractional horsepower motor on a support wall generally designated by the reference numeral 12.

Figure 2:
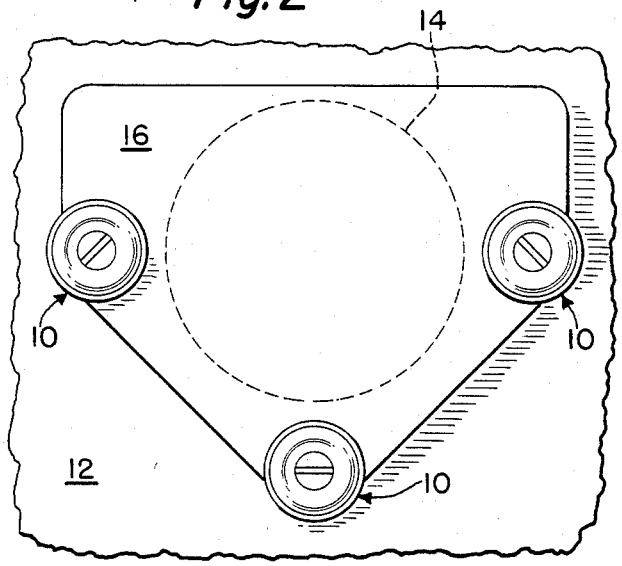
FIG. 2 is a front elevational view showing the manner in which three resilient grommets embodying the principles of this invention would mount a fractional horsepower motor housing on a vertical support wall.

Referring to FIG. 2 there is diagramatically illustrated a fractional horsepower motor 14 having a base plate 16. The motor 14 and associated base plate 16 are fastened to the wall 12 in a spaced apart relationship by virtue of the three identical grommets 10. One of the critical design features of the grommets 10 is to be able to isolate the vibration and associated propagated noise waves which are generated by the motor 14 from the support wall 12. An example where such a mounting arrangement is used is to mount a windshield wiper motor on the firewall of a passenger vehicle so that the occupants of the vehicle will not hear or feel the vibrations and noise emanating from the motor.

As is clearly depicted in FIGS. 3 through 7, the resilient grommet 10 has a one-piece generally cylindrical shaped body 18 having a central sleeve portion 20 with an axial opening 22.

There is integrally formed on the central sleeve portion 20 a pair of vibration dampening members 24 and 26. The vibration dampening members 24 and 26 have similar construction.

Vibration dampening member 26 has a generally cup shaped configuration consisting of a circular end wall 40 integrally formed with central sleeve portion 20 and an outer annular wall 32 which is coaxial with the axis of the one-piece body 18.

Likewise, vibration dampening member 24 has a circular end wall 34 integrally formed with central sleeve portion 20 having a circular end wall 38 and an outer annular wall 36 extending coaxially with the axis of the body 18.

The vibration dampening members 24 and 26 have open end faces 38 and 40, respectively. The vibration dampening member 24 has a plurality of radial rib members 42 which are formed integrally between the center sleeve portion 20 and the annular wall member 36 and which extend between the circular end wall 34 and the open end face 38. Likewise, vibration dampening member 26 has a plurality of radial rib members 44, which extend between the circular sleeve portion 20 and the annular wall 32 and which extend between the circular end wall 30 and the open end face 40.

Figure 3:
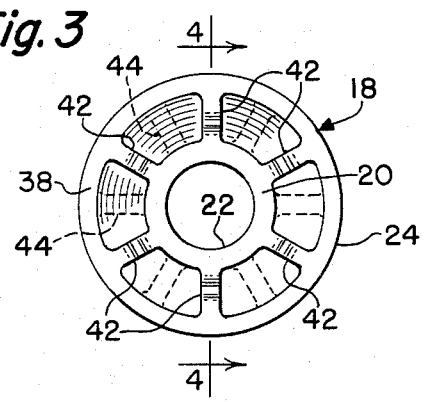
FIG. 3 is an end view of the resilient grommet illustrated in FIG. 1 taken from the left side thereof.
Figure 4:
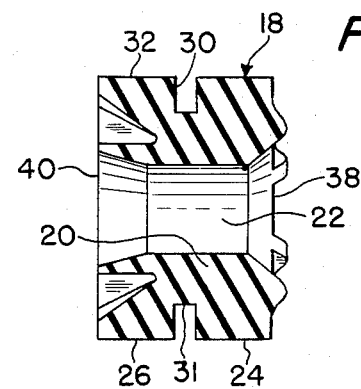
FIG. 4 is a cross-sectional view of FIG. 3 taken along the lines 4—4.
Figure 5:
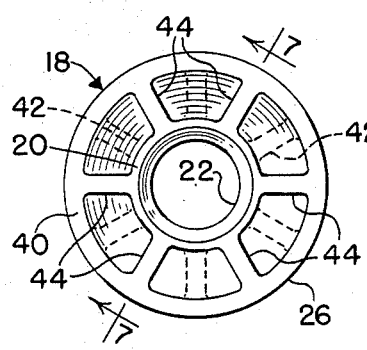
FIG. 5 is an end view of the resilient grommet illustrated in FIG. 1 taken from the right hand side.
Figure 6:
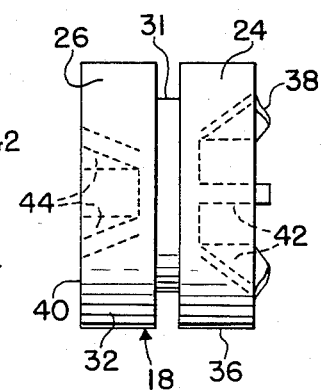
FIG. 6 is a side elevational view of the resilient grommet illustrated in FIG. 1.
Figure 7:
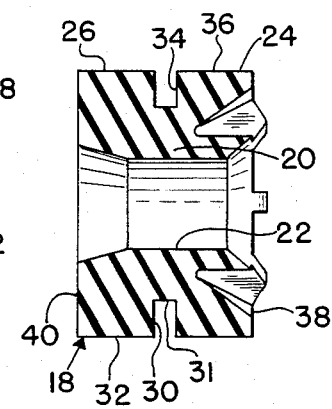
FIG. 7 is a cross-sectional view of FIG. 5 taken along the lines 7—7.

It will be appreciated from referring to FIGS. 3 and 5, that the set of radial rib members 42 for vibration dampening member 24 are angularly offset from the set of radial rib members 44 of vibration dampening member 26 in an axial direction. The purpose of this angular offset arrangement is to interrupt the wave propagation of the vibration and noise components emanating from the motor 14 as these waves are propagated axially of the grommet 10. Experiments with the grommet 10 have proven that this angular offset arrangement of the ribs 42 and 44 is quite effective to reduce the transmitted vibration to a negligible amount which is neither heard nor felt along the support wall 12 when the baseplate 16 of fractional horsepower motor 14 is mounted in the annular recess 31 of grommet 10 for the three spaced apart grommets as shown in FIG. 2.

The preferred manner of mounting the grommet 10 on a support wall 12 is to use a fastener, such as the threaded screw 50 and mating threaded nut 52 in the manner depicted in FIG. 1. A spool 54 is provided to cooperate between the screw 50 and grommet 10 to provide a tight interfitting relationship. Spool 54 is formed with a cylindrical hollow shank portion 56 and head portion 58. The hollow shank portion 56 has an outer diameter slightly smaller than the inner diameter of axial opening 22 of one-piece grommet 10 and has an inner diameter slightly larger than the outer diameter of the screw 50.

The head 58 of spool 54 is illustrated as having a frusto-conical shape which terminates in an outer circular flange 60. As depicted in FIG. 1, the head 50 is shaped to seat the head of screw 50 in a countersink arrangement.

Referring to FIG. 1 the relative position of the parts are depicted with grommet 10 held uncompressed against the support wall 12. To securely mount the motor housing plate 16 in a spaced apart relation from support wall 12 and to isolate the wall from the vibrations of the motor 14, the screw 50 is tightened into the nut 52 to axially compress the one-piece grommet 10. The length of the hollow shank portion 56 of spool 54 is selected such that its end 64 will engage the support wall 12 in order to act as a stop means and thereby avoid over-tightening the screw 60 and causing damage to grommet 10.

The shape of the head member 58 of spool 54 is illustrated as having a frusto-conical shape with a circular flange portion 60. The significance of this shape is relative to the shape of the endface 38 of ribs 42. Head portion 58 must conform to the shape of the endface 38 of ribs 42 to uniformly compress the ribs in an axial direction towards the support wall 12. Thus combination of a flat end face 38 and flat head member 54 would function just as effectively as that shown in FIG. 1. Of course by using the frusto-conical configuration for the head member 58 the head of the screw 50 is countersunk for a more pleasing appearance.

The one-piece resilient grommet 10 can be made of a variety of known elastomeric materials. The primary characteristic of such materials must be the ability to be molded to the shape as described hereinabove, the resiliency to be compressed and the durability to withstand constant vibration forces. The spool 54 can be made of a variety of rigid materials, such as metal or plastic, which can be shaped into a spool configuration and which can have the strength to interfit between a screw and the resilient grommet to compress the resilient grommet as the screw is tightened.

I claim:

1. The combination of a one-piece integral resilient grommet of elastomeric material and a non-deformable spool for mounting a fractional horsepower motor or the like on a support surface in a spaced apart relation and to reduce the vibration and associated noise propagation to a negligible amount, said grommet comprising a center sleeve portion of resilient deformable material having a cylindrical center opening, a pair of spaced apart vibration dampening members integrally formed of resilient deformable material around said sleeve portion, each of said vibration dampening members having a circular end wall extending radially from said sleeve portion and an outer annular wall extending coaxially of said cylindrical center opening, a first set of radially extending ribs of resilient deformable material extending axially from one of said circular end walls between its sleeve portion and its outer annular wall, and a second set of radially extending ribs of resilient deformable material extending axially from the other of said circular end walls between its sleeve portion and its outer annular wall, where said first and second set of radially extending ribs are angularly offset in an axial direction from each other, and said non-deformable spool includes a hollow shank portion with an outer diameter slightly smaller than said cylindrical center opening and a head portion having a central aperture the size of said outer diameter for said hollow shank portion, and the other end face of said resilient grommet being shaped to conform to the underside of said head portion of said spool such that said head portion engages substantially the entire surface area of said other end face and where said circular end wall of said pair of spaced apart vibration dampening members are separated by a selected distance to define an annular recess for mounting said motor or like component to be vibrationally isolated.

2. The combination as defined in claim 1, wherein said non-deformable spool further includes stop means for determining the maximum axial compression of said resilient grommet when being secured to a support surface by a fastener inserted through said cylindrical center opening of said grommet.

3. The combination of claim 2, wherein said stop means comprises said hollow shank portion terminating a distance from said one end face of said resilient grommet when said grommet is axially uncompressed.

* * * * *